(12) United States Patent
Shimada et al.

(10) Patent No.: US 8,377,745 B2
(45) Date of Patent: Feb. 19, 2013

(54) METHOD OF FORMING A SEMICONDUCTOR DEVICE

(75) Inventors: Noriou Shimada, Tokyo (JP); Tomoyuki Fujishima, Tokyo (JP)

(73) Assignee: Elpida Memory, Tokyo (JP)

( * ) Notice: Subject to any disclaimer, the term of this patent is extended or adjusted under 35 U.S.C. 154(b) by 107 days.

(21) Appl. No.: 13/104,560

(22) Filed: May 10, 2011

(65) Prior Publication Data

US 2011/0287582 A1   Nov. 24, 2011

(30) Foreign Application Priority Data

May 18, 2010   (JP) ................. 2010-114208

(51) Int. Cl.
*H01L 21/44*   (2006.01)
*H01L 21/48*   (2006.01)
*H01L 21/50*   (2006.01)

(52) U.S. Cl. ............. 438/106; 438/109; 257/E21.499
(58) Field of Classification Search ........... 438/106, 438/109, 112; 257/E21.499
See application file for complete search history.

(56) References Cited

U.S. PATENT DOCUMENTS

| 7,413,925 B2 | 8/2008 | Egawa |
| 2010/0129961 A1* | 5/2010 | Horibe et al. ............. 438/109 |

FOREIGN PATENT DOCUMENTS

JP   2007-214220 A   8/2007

* cited by examiner

*Primary Examiner* — Hoai V Pham
(74) *Attorney, Agent, or Firm* — Foley & Lardner LLP

(57) ABSTRACT

A method of forming a semiconductor device includes filling a gap of a semiconductor chip stack while carrying out a first heating process which heats the semiconductor chip stack from upper and lower portions of the semiconductor chip stack.

20 Claims, 4 Drawing Sheets

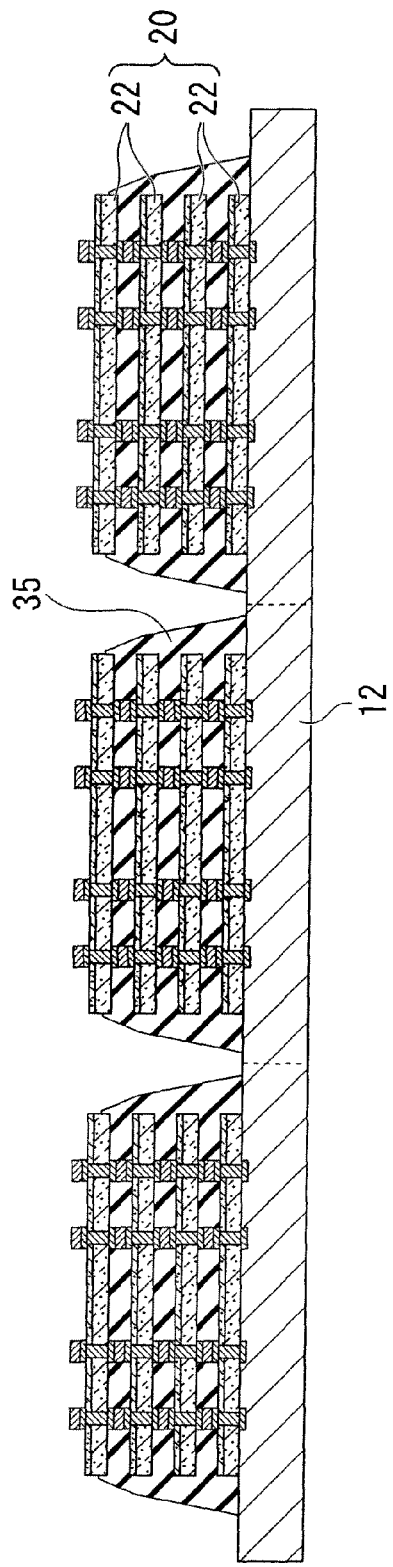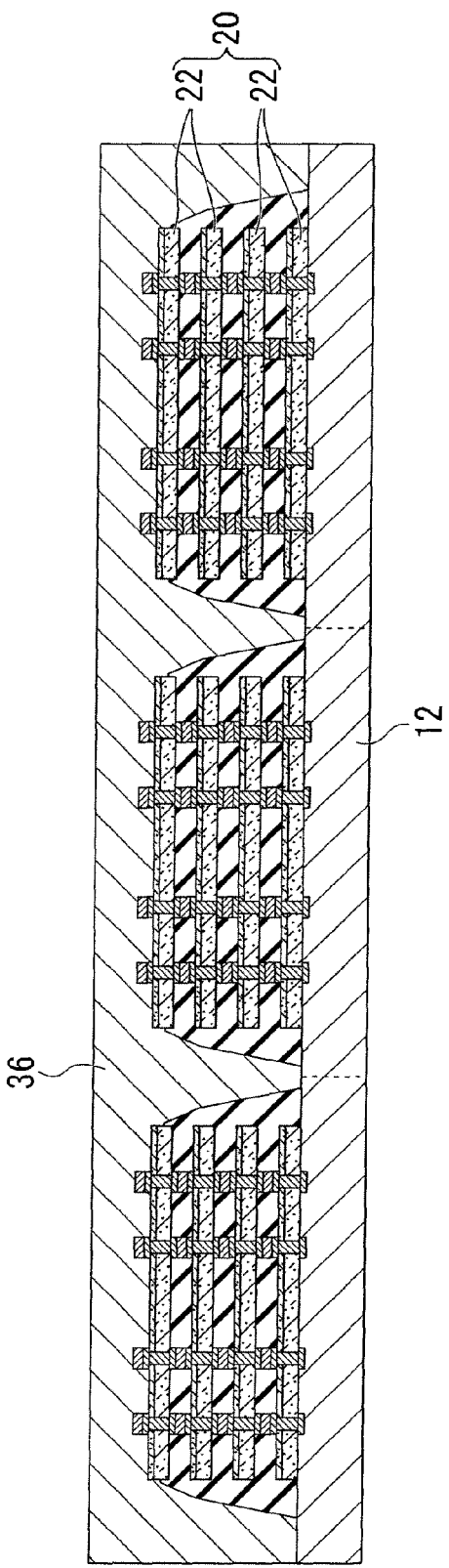

METHOD OF FORMING A SEMICONDUCTOR DEVICE

BACKGROUND OF THE INVENTION

1. Field of the Invention

The present invention generally relates to a method of forming a semiconductor device.

Priority is claimed on Japanese Patent Application No. 2010-114208, May 18, 2010, the content of which is incorporated herein by reference.

2. Description of the Related Art

In recent years, chip-on-chip (CoC) type semiconductor devices have received attention, in which through silicon via (TSV) chips are stacked in plurality. Through electrodes are disposed in the TSV chips. Bump electrodes are bonded to each other via through electrodes so that the TSV chips are stacked. However, the bump electrodes have a height of about several micrometers to tens of micrometers. The small height of the bump electrodes can form a narrower gap between the TSV chips than the minimum gap. The minimum gap needs to allow the gap to be sealed with sealing agents without forming a lot of voids. When the semiconductor device is sealed by a molding process, there is a probability of formation of voids in the gap of the TSV chips.

Japanese Unexamined Patent Application, First Publication, No. JP-A-2007-214220 discloses a method of injecting an underfill from sides of TSV chip stacks in advance to prevent the formation of voids. After the underfill is heated and hardened, the entire surfaces of the TSV chip stacks are overmolded by a mold resin so that the occurrence of voids can be prevented between the TSV chips in overmolding. In addition, as such a molding method, a transfer molding method using a mold having a predetermined size has been disclosed.

SUMMARY

In one embodiment, a method of forming a semiconductor device may include, but is not limited to, filling a gap of a semiconductor chip stack with a sealing agent while carrying out a first heating process which heats the semiconductor chip stack from upper and lower portions of the semiconductor chip stack.

In another embodiment, a method of forming a semiconductor device may include, but is not limited to, filling between first and second semiconductor chips of a semiconductor chip stack with a sealing agent while heating the first and second semiconductor chips of the semiconductor chip stack using a heater and a heat stage. The first semiconductor chip is heated by at least the heat stage. The second semiconductor chip is heated by at least the heater. Heating the first and second semiconductor chips is started before filling between the first and second semiconductor chips of a semiconductor chip stack.

In still another embodiment, a method of forming a semiconductor device may include, but is not limited to, the following processes. A plurality of semiconductor chips are stacked to form a chip stack structure. The chip stack structure is heated to apply thermal energy to the chip stack structure from both of lowermost and uppermost ones of the semiconductor chips of the chip stack structure. A sealing resin is supplied to fill gaps between the semiconductor chips while heating the chip stack structure.

BRIEF DESCRIPTION OF THE DRAWINGS

The above features and advantages of the present invention will be more apparent from the following description of certain preferred embodiments taken in conjunction with the accompanying drawings, in which:

FIG. 2A is a fragmentary cross sectional elevation view illustrating the CoC semiconductor device in a step, subsequent to the step of FIG. 1D, involved in the method of forming the CoC semiconductor device in accordance with one embodiment of the present invention;

FIG. 2B is a fragmentary cross sectional elevation view illustrating the CoC semiconductor device in a step, subsequent to the step of FIG. 2A, involved in the method of forming the CoC semiconductor device in accordance with one embodiment of the present invention;

DETAILED DESCRIPTION OF THE PREFERRED EMBODIMENTS

Figure 1A:
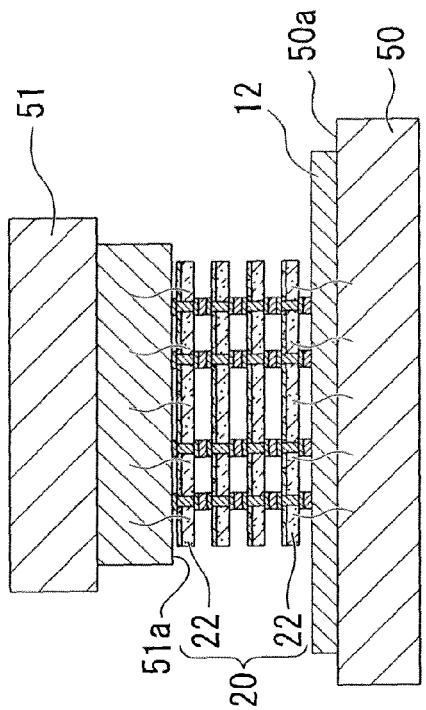
FIG. 1A is a fragmentary cross sectional elevation view illustrating a CoC semiconductor device in a step involved in a method of forming the CoC semiconductor device in accordance with one embodiment of the present invention.

Before describing the present invention, the related art will be explained in detail, in order to facilitate the understanding of the present invention.

When a first sealing resin, the underfill, fills gaps of the TSV chip stacks, the TSV chip stacks with the first sealing resin receive a heat from a substrate over which the TSV chip stacks are disposed in the method disclosed by Japanese Unexamined Patent Application, First Publication, No. JP-A-2007-214220. Among semiconductor chips of the chip stacks, the first sealing resin between the semiconductor chips closer to the substrate than the other semiconductor chips is sufficiently heated so that the first sealing resin flows well. However, there is not sufficiently heated the first sealing resin between the other semiconductor chips which are apart from the substrate. The first sealing resin does not flow well than the first sealing resin between the semiconductor chips closer to the substrate. There is caused a difference in speed of flow of the first sealing resin between the gap between the semiconductor chips closer to the substrate and the other gap between the other semiconductor chips.

A flow rate that the first sealing resin flows from a supply side of the first sealing resin to a side facing the supply side varies depending on the different gaps. The first sealing resin reached first covers a sidewall of the facing side of the chip stack before the first sealing resins of other regions reach the facing side. Thereby, it can cause voids in the chip stack. The voids can cause cracks in reflowing and lowering the reliability of the semiconductor device.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a method of forming a semiconductor device may include, but is not limited to, filling a gap of a semiconductor chip stack with a sealing agent while carrying out a first heating process which heats the semiconductor chip stack from upper and lower portions of the semiconductor chip stack.

In some cases, the method may include, but is not limited to, the first heating process being started before filling the gap of a semiconductor chip stack.

In some cases, the method may further include, but is not limited to, hardening the sealing agent by carrying out a second heating process which heats the semiconductor chip stack after the first heating process the semiconductor chip stack.

In some cases, the first heating process may include, but is not limited to, concurrently heating the upper and lower portions of the semiconductor chip stack.

In some cases, concurrently heating the upper portion and the lower portion of the semiconductor chip stack may include, but is not limited to, concurrently heating the upper portion of the semiconductor chip stack by a heater and the lower portion of the semiconductor chip stack by a heat stage.

In some cases, the method may further include, disposing a first sheet on a surface of the heater before the first heating process and disposing a second sheet on a surface of the heat stage before the first heating process.

In some cases, concurrently heating the upper portion of the semiconductor chip stack by the heater and the lower portion of the semiconductor chip stack by the heat stage may further include, but is not limited to, concurrently heating the upper portion of the semiconductor chip stack by the heater and the lower portion of the semiconductor chip stack by the heat stage, the heater being substantially the same in temperature as the heat stage.

In some cases, the method may further include, but is not limited to, the heater having a contact portion which is greater in area than the upper portion of the semiconductor chip stack and the heat stage being greater in area than the lower portion of the semiconductor chip stack.

In some cases, the first heating process may include, but is not limited to, heating the semiconductor chip stack at a temperature which causes the sealing agent to flow.

In another embodiment, a method of forming a semiconductor device may include, but is not limited to, filling between first and second semiconductor chips of a semiconductor chip stack with a sealing agent while heating the first and second semiconductor chips of the semiconductor chip stack using a heater and a heat stage, The first semiconductor chip is heated by at least the heat stage. The second semiconductor chip is heated by at least the heater. Heating the first and second semiconductor chips is started before filling between the first and second semiconductor chips of a semiconductor chip stack.

In some cases, the heating the first and second semiconductor chips of the semiconductor chip stack may include, but is not limited to, concurrently heating the first and second semiconductor chips of the semiconductor chip stack.

In some cases, the method may further include, but is not limited to, pressing the semiconductor chip stack by the heater.

In some cases, the method may further include, but is not limited to, curing the sealing agent by increasing a temperature of the heater and the heat stage.

In some cases, the method may include, but is not limited to, the heater having a contact portion which is greater in area than the second semiconductor chip and the heat stage being greater in area than the first semiconductor chip.

In still another embodiment, a method of forming a semiconductor device may include, but is not limited to, the following processes. A plurality of semiconductor chips are stacked to form a chip stack structure. The chip stack structure is heated to apply thermal energy to the chip stack structure from both of lowermost and uppermost ones of the semiconductor chips of the chip stack structure. A sealing resin is supplied to fill gaps between the semiconductor chips while heating the chip stack structure.

In some cases, heating the chip stack structure may include, but is not limited to, sandwiching the chip stack structure between first and second heaters.

In some cases, the method may further include, but is not limited to, heating up the chip stack structure after applying the sealing resin to harden the sealing resin.

In some cases, the method may further include, but is not limited to, the following processes. A first sheet is disposed between the lowermost one of the plurality of semiconductor chips of the chip stack structure and the first heater before heating the chip stack structure. A second sheet is disposed between the uppermost one of the plurality of semiconductor chips of the chip stack structure and the second heater before heating the chip stack structure.

In some cases, the method may further include, but is not limited to, mounting the chip stack structure on a wiring board after applying the sealing resin.

In some cases, stacking the plurality of semiconductor chips may include, stacking the plurality of the semiconductor chips on a wiring board to form the chip structure on the wiring board.

Hereinafter, a semiconductor device according to an embodiment of the invention will be described in detail with reference to the drawings. In the embodiment, an example of applying the invention to a DRAM (Dynamic Random Access Memory) as the semiconductor device will be described. In the drawings used for the following description, to easily understand characteristics, there is a case where characteristic parts are enlarged and shown for convenience' sake, and ratios of constituent elements may not be the same as in reality. Materials, sizes, and the like exemplified in the following description are just examples. The invention is not limited thereto and may be appropriately modified within a scope which does not deviate from the concept of the invention.

First Embodiment

Hereinafter, a method of forming a semiconductor device according to a first embodiment of the present invention will be described with reference to FIG. 1.

A method of forming a semiconductor device according to the present embodiment schematically may include the following processes. A chip stack 20 is formed by stacking a plurality of semiconductor chips (TSV chips) 22. A first sealing resin (underfill) 34 fills between the semiconductor chips 22. The first sealing resin 34 is hardened. A first sealant 35 formed of the hardened first sealing resin 34 and the chip stack 20 is sealed using a second sealing resin 36. Hereinafter, the respective processes will be described in detail.

Process of Forming Chip Stack 20

As shown in FIG. 1A, the chip stack 20 is formed on a wiring board 12. The wiring board 12 may be, but is not limited to, a wiring board in which wiring layers are formed on both surfaces of a glass epoxy base material. The wiring board 12 is held and fixed on a bonding stage 50, for example, by vacuum adsorption or the like. The wiring board 12 has connection pads on one surface thereof. A semiconductor chip 22 is mounted on one surface of the wiring board 12. A plurality of first columnar bump electrodes 26 and a plurality of second columnar bump electrodes 27 are formed on one surface and the other surface of the semiconductor chip 22, respectively. A plurality of first through electrodes 30 are formed to penetrate the semiconductor chip 22 so that the first bump electrodes 26 are electrically connected to the second bump electrodes 27 via the first through electrodes 30. A first circuit layer 22a is formed on the one surface of the semiconductor chip 22.

At this time, the semiconductor chip 22 is mounted on the wiring board 12 by a flip chip bonding process so that positions of the second bump electrodes 27 of the semiconductor chip 22 correspond to positions of the connection pads of the wiring board 12, respectively. The semiconductor chip 22 is heated to a temperature of about 150° C. and weighted by the flip chip bonding so that the second bump electrodes 27 of the semiconductor chip 22 are pre-fixed to the connection pads of the wiring board 12.

A semiconductor chip 22 of a second stage is mounted on one surface of the semiconductor chip 22 mounted on the wiring board 12 by the flip chip bonding process as described above. Semiconductor chips 22 are stacked by repeating the above-described process a predetermined number of times to form the chip stack 20. In some cases, four semiconductor chips 22 are stacked to form the chip stack 20. Then, the chip stack 20 is heated at a temperature of, for example, about 300° C. and weighted so that adjacent bump electrodes (the first bump electrodes 26 and the second bump electrodes 27) are bonded to each other. The method of bonding the bumps is not limited to weight application, but an ultrasonic wave application may be used. Thereby, the bump electrodes corresponding to each other are electrically connected so that the respective semiconductor chips 22 of the chip stack 20 are electrically connected to each other via the first through electrodes 30.

Here, the bonding of the bump electrodes may not be performed. The bonding of the bump electrodes may be performed when the chip stack 20 is pressed as will be described later.

A method of forming the chip stack 20 is not limited to this method, but a ball grid array (BGA) assembly apparatus may be used.

In this embodiment, the chip stack 20 including four semiconductor chips 22 is formed, but the configuration of the chip stack 20 is not limited thereto. The chip stack 20 includes at least one semiconductor chip 22. In some cases, the chip stack 20 includes a plurality of semiconductor chips 22. As long as the outermost surface of the chip stack 20 is not covered by the first sealing resin 34 which fills gaps between the semiconductor chips 22, the number of the semiconductor chips 22 and the configuration of the semiconductor chip are not limited to what are described above.

A method of forming the chip stack 20 is not limited to the method described above. For example, after a plurality of semiconductor chips 22 are stacked and disposed by a flip chip bonding process in advance, the chip stack 20 may be mounted at a predetermined position of the surface of the wiring board 12. In this case, for example, first and second semiconductor chips 22 are stacked so that the second bump electrodes 27 of the second semiconductor chip 22 position on the first bump electrodes 26 of the first semiconductor chip 22 respectively. A third semiconductor chip 22 is stacked on the second semiconductor chip so that the second bump electrodes 27 of the third semiconductor chip 22 position on the first bump electrodes 26 of the second semiconductor chip 22 respectively. In each stacking step of the semiconductor chips 22, the first bump electrodes 26 and the second bump electrodes 27 are pre-fixed to each other. After stacking the semiconductor chips 22 is completed, the chip stack 20 may be heated and pressed so that a main bonding process may be performed. Then, the chip stack 20 may be mounted on the wiring board 12. In such a method, the chip stack 20 is foilled on the wiring board 12 by sequentially stacking the semiconductor chips 22 on the wiring board 12.

Process of Filling Gaps Between Semiconductor Chips 22 with First Sealing Resin 34

The process of filling gaps between the semiconductor chips 22 with the first sealing resin 34 may include the following processes. The chip stack 20 is pre-heated. The first sealing resin 34 is supplied from the side of the chip stack 20. Hereinafter, the respective processes will be described in detail.

Figure 1B:
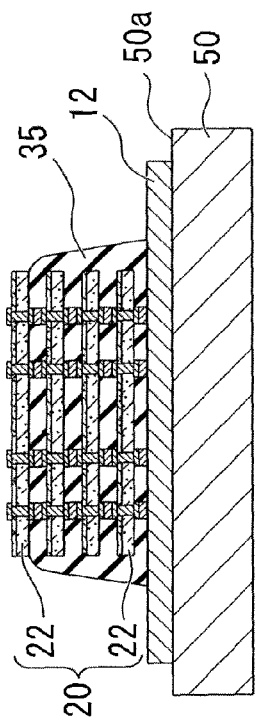
FIG. 1B is a fragmentary cross sectional elevation view illustrating the CoC semiconductor device in a step, subsequent to the step of FIG. 1A, involved in the method of forming the CoC semiconductor device in accordance with one embodiment of the present invention.

As shown in FIG. 1B, a pre-heating process is started on the chip stack 20. Specifically, the wiring board 12 on the heat stage is heated by a heater (not shown) of the heat stage 50 while an uppermost semiconductor chip 22 of the chip stack 20, which is also referred to as an upper portion of the chip stack 20, is heated by a heater 51. In some cases, the wiring board 12 on the heat stage is heated by a heater (not shown) of the heat stage 50 and concurrently an uppermost semiconductor chip 22 of the chip stack 20, which is also referred to as an upper portion of the chip stack 20, is heated by a heater 51. The heater 51 contacts the uppermost semiconductor chip 22 of the chip stack 20. A main pressing process for connecting the bumps of the chip stack 20 may be performed by heating and pressing the chip stack 20 from the uppermost semiconductor chip 22 by the heater 51.

In this embodiment, the heat stage 50 and the heater 51 have heating functions (not shown). Such heating functions may be realized by, but not limited to, electrical heaters such as a Peltier element or the like. The electrical heaters such as the Peltier element are capable of immediate temperature control so that the heating can be preferably performed in a short working time.

The heat stage 50 may have a flat mounting surface 50a. The heater 51 may have a flat contact surface 51a. The mounting surface 50a and the contact surface 51a in plan view may be larger in area than the chip stack 20 (the semiconductor chip 22) in plan view. The mounting surface 50a may cover the whole surface of the uppermost semiconductor chip 22. The contact surface 51a may cover the whole of a lowermost semiconductor chip 22 of the chip stack 20. Thereby, the uppermost semiconductor chip 22 and the wiring board 12 can be uniformly heated.

When the bonding of the bump electrodes is not performed, the bump electrodes may be bonded when the chip stack 20 is pressed by the heater 51.

A pre-heating process is performed in a state where the mounting surface 50a and the contact surface 51a are in contact with the chip stack 20. The chip stack 20 is heated from the uppermost semiconductor chip 22 of the chip stack 20 by the heater 51 while the chip stack 20 is heated from the wiring board 12 by the heat stage 50. In some cases, the chip stack 20 is concurrently heated from the uppermost semiconductor chip 22 of the chip stack 20 and the wiring board 12 by the heater 51 and the heat stage 50, respectively. A temperature difference between the uppermost semiconductor chip 22 and the lowermost semiconductor chip 22 of the chip stack 20 can be reduced.

The heating temperature in the pre-heating process may be set so that the first sealing resin 34 flows well. The first sealing resin 34 may fill between the semiconductor chips 22 in a process to be described later with keeping the good flowability of the first sealing resin 34.

The heating temperature at this time may be, but is not limited to, below 130° C. In some cases, the heating temperature may be about 90° C. The first sealing resin 34 flows well at the heating temperature of about 90° C. Meanwhile, when the heating temperature is 130° C. or more, it is not preferable because the first sealing resin 34 is hardened by heat.

In the related art, the flow of the first sealing resin in a first gap of the chip stack is slower than flow of the first sealing resin in the second gap of the chip stack. The first gap is between the semiconductor chips in the vicinity of the uppermost semiconductor chip. The second gap is between the semiconductor chips in the vicinity of the lowermost semiconductor chip. This is because the chip stack is heated from only the bottom of the chip stack. Therefore, the first sealing resin having flowed in the second gap may enter into the first gap, which may cause the occurrence of voids in the first gap.

In the present embodiment, the chip stack 20 is heated from the uppermost semiconductor chip 22 and the lowermost semiconductor chip 22 by the heat stage 50 and the heater 51, respectively. The heating temperature of the heat stage 50 may be substantially the same as that of the heater 51. The chip stack 20 may have substantially uniform temperature profile during the heat process as compared to the related art. A temperature difference between the uppermost semiconductor chip 22 and the lowermost semiconductor chip 22 of the chip stack 20 is reduced. The flow rates of the first sealing resin 34 to be described later can be substantially the same between in the first and the second gaps of the chip stack 20. Substantially the same flow rates can prevent that the first sealing resin 34 flows into a first gap from the other gap lower than the first gap. The occurrence of voids in the chip stack 20 can be prevented.

Figure 1C:
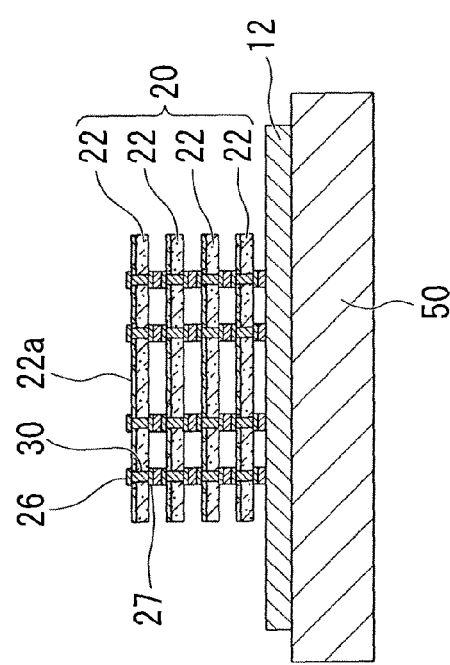
FIG. 1C is a fragmentary cross sectional elevation view illustrating the CoC semiconductor device in a step, subsequent to the step of FIG. 1B involved in the method of forming the CoC semiconductor device in accordance with one embodiment of the present invention.

As shown in FIG. 1C, the first sealing resin 34 is supplied from the side of the chip stack 20. For example, an epoxy-based thermosetting resin may be used as the first sealing resin 34, but is not limited to. Other materials may be used. In this case, the heating temperature of the chip stack 20 may be appropriately set in the same manner as the heating temperature in the pre-heating process as described above. The heating temperature of the chip stack 20 may be set so that the first sealing resin 34 flows well. The heating temperature at this time may be, but is not limited to, below 130° C. In some cases, the heating temperature may be about 90° C. The first sealing resin 34 flows well at the heating temperature of about 90° C. In some cases, an appropriate heating temperature of the chip stack 20 may depend on the kinds of materials of the first sealing resin 34.

While the uppermost semiconductor chip 22 and the lowermost semiconductor chip 22 of the chip stack 20 are heated to a predetermined temperature, the liquefied first sealing resin 34 is supplied to a position near the side of the chip stack 20 by an applicator such as a nozzle 52 for filling the gaps between the semiconductor chips 22 with the first sealing resin 34. Of the chip stack 20, a side from which the first sealing resin 34 is supplied is referred to as a supplying side X and a side opposite to the supplying side X is referred to as a facing side Y.

Thereby, the first sealing resin 34 fills the gaps between the semiconductor chips 22 and fills between the semiconductor chip 22 and the wiring board 12 by the capillary phenomenon while the first sealing resin 34 flows from the supplying side X to the facing side Y. Since the uppermost semiconductor chip 22 and the lowermost semiconductor chip 22 of the chip stack 20 are heated to substantially the same temperature, the first sealing resin 34 flows uniformly over the whole region of the gaps between the semiconductor chips 22. Accordingly, the first sealing resin 34 uniformly fills the gaps between the semiconductor chips 22. Different parts of the first sealing resin 34 flow through different gaps between the semiconductor chips 22 and reach the facing side Y almost simultaneously. The first sealing resin 34 is not localized and not over-filled within the gap between the semiconductor chips 22. The first sealing resin 34 having reached the facing side Y does not enter into the other gap from the facing side Y.

After the first sealing resin 34 reaches the facing side Y, the side of the chip stack 20 is covered by an over-flowed first sealing resin 34. A part of the first sealing resin 34 surrounds the chip stack 20. The part of the first sealing resin 34 has a generally trapezoidal shape in a vertical cross-sectional view due to the flowability of the first sealing resin 34 and the gravity.

The process of filling the gaps between the semiconductor chips 22 with the first sealing resin 34 may be performed in decompression conditions, for example, in a vacuum-induced condition. Thereby, the filling ability can be further improved.

Process of Hardening First Sealing Resin 34

In some cases, the first sealing resin 34 may be heat-cured and may be made into a first sealant 35 using a baking furnace (not shown) at a predetermined temperature of, but is not limited to, about 130° C. In other cases, subsequent to filling the gaps between the semiconductor chips 22 with the first sealing resin 34, the process of hardening the first sealing resin 34 may be performed while pressing the chip stack 20 as shown in FIG. 1C. In this case, temperatures of the heat stage 50 and the heater 51 are increased up to a curing temperature, thereby curing the first sealing resin 34. The first sealing resin 34 may be hardened while the chip stack 20 is pressed by the heat stage 50 and the heater 51.

Figure 1D:
FIG. 1D is a fragmentary cross sectional elevation view illustrating the CoC semiconductor device in a step, subsequent to the step of FIG. 1C, involved in the method of forming the CoC semiconductor device in accordance with one embodiment of the present invention.

The heater 51 is pull up and the contact surface 51a is detached from the chip stack 20 as shown in FIG. 1D.

Process of Sealing Chip Stack 20 with First Sealant 35 Using Second Sealant

The wiring board 12 is molded by a casting mold of a transfer molding apparatus so that the chip stack 20 with the first sealant 35 formed on the wiring board 12 are sealed by a second sealing resin 36 as shown in FIGS. 2A and 2B. The second sealing resin 36 is cured at a predetermined temperature so as to form the second sealing resin 36 which covers the chip stacks 20 on the surface of the wiring board 12 as well as covers the sides of the first sealants 35 and the surface of the wiring board 12 between the chip stacks 20. The wiring board 12 with the chip stacks 20 is baked at a predetermined temperature. The second sealing resin 36 is well hardened to become a second sealant.

Since the first sealant 35 fills the gaps between the semiconductor chips 22 and between the semiconductor chip 22 and the wiring board 12, it is possible to perform overmolding of the first sealant 35 and the wiring board 12 without defect due to overheating in this process.

Processes of forming a BGA semiconductor device such as a process of mounting solder balls on the other surface of the wiring board 12 and a process of dicing the wiring board 12 for each product formation region are sequentially performed so that the semiconductor device of the present embodiment is formed.

According to the method of forming the semiconductor device of the present embodiment, the chip stack 20 is heated from the uppermost semiconductor chip 22 while the chip stack 20 is heated from the lowermost semiconductor chip 22. In some cases, the chip stack 20 is concurrently heated from the uppermost semiconductor chip 22 and the lowermost semiconductor chip 22. The chip stack 20 may have substantially uniform temperature profile during the heat process as compared to the related art. The temperature difference between the uppermost semiconductor chip 22 and the lowermost semiconductor chip 22 of the chip stack 20 can be reduced. Thus, the flow rates of the first sealing resin 34 can be substantially the same between in the gap between the semiconductor chips 22 and in the gap between the semiconductor chip 22 and the wiring board 12. Substantially the same flow rates can prevent that the first sealing resin 34 flows into a first gap from the other gap lower than the first gap. The first sealing resin 34 having flowed in each gap between the semiconductor chips 22 almost simultaneously reaches the facing side Y. The first sealing resin 34 having reached the facing side Y does not enter the other gap from the facing side Y.

Substantially the same flow rates can prevent an occurrence of voids between the semiconductor chips 22. Thus, cracks or the like are not caused in a reflowing process, which can improve the reliability of the semiconductor device.

The first sealing resin 34 is heated from both surfaces of the uppermost semiconductor chip 22 and the lowermost semiconductor chip 22 of the chip stack 20. The first sealing resin 34 can be simultaneously uniformly heated to an appropriate temperature. Thus, the first sealing resin 34 can flow well and a processing time can be shortened.

Second Embodiment

Hereinafter, a method of forming a semiconductor device according to a second embodiment of the present invention will be described with reference to FIGS. 3 and 4A through 4C. The method of forming the semiconductor device of the present embodiment schematically may include the following processes. A chip stack 20 is formed. A first sealing resin 34 fills the gaps between semiconductor chips 22. The first sealing resin 34 is hardened to be a first sealant 35. The first sealant 35 and the chip stack 20 are sealed using a second sealant. In this embodiment, the first sealing resin 34 fills in the chip stack 20 which is not mounted on the wiring board 12 in contrast to the first embodiment. Descriptions of portions which are the same as those in the first embodiment will be omitted.

Process of Forming Chip Stack 20

A plurality of semiconductor chips 22 are stacked to form the chip stack 20 as in the first embodiment. A heat stage 50 on which a first sheet 60 is disposed is prepared. The chip stack 20 is mounted on the first sheet 60. The chip stack 20 is mounted on an mounting surface 50a while the first sheet 60 is interposed between the chip stack 20 and the mounting surface 50a.

The first sheet 60 is a sheet having heat-resistance and flexibility. The first sheet 60 may be formed of but is not limited to, a polyester or polyimide-based weak adhesive sheet. The first sheet 60 is disposed to cover the mounting surface 50a (one surface of the mounting surface 50a).

The first sheet 60 may be formed to cover the mounting surface 50a by a coating material film with a thickness of at least tens of micro-meters (not shown) instead of disposing the first sheet 60 on the mounting surface 50a in advance. Specifically, a coating material having heating-resistance and flexibility is coated to cover the mounting surface 50a of the heat stage 50, thereby foaming the first sheet 60 covering the mounting surface 50a. The coating material may be, but is not limited to, a highly thermally stable coating material having a modulus of elasticity of several hundreds of mega-Pascal.

The process of forming the chip stack 20 is not limited to the method of the present embodiment. For example, the semiconductor chips 22 may be sequentially stacked on a predetermined position of one surface of the first sheet 60 after the first sheet 60 is disposed on the heat stage 50 in advance.

In the same manner, a second sheet 61 may be disposed to cover a contact surface 51a of a heater 51. The second sheet 61 may be formed to cover the contact surface 51a by a film. The second sheet 61 includes the same material as the first sheet 60, and thus its detailed description will be omitted.

Process of Filling Between Semiconductor Chips 22 with First Sealing Resin 34

Figure 3:
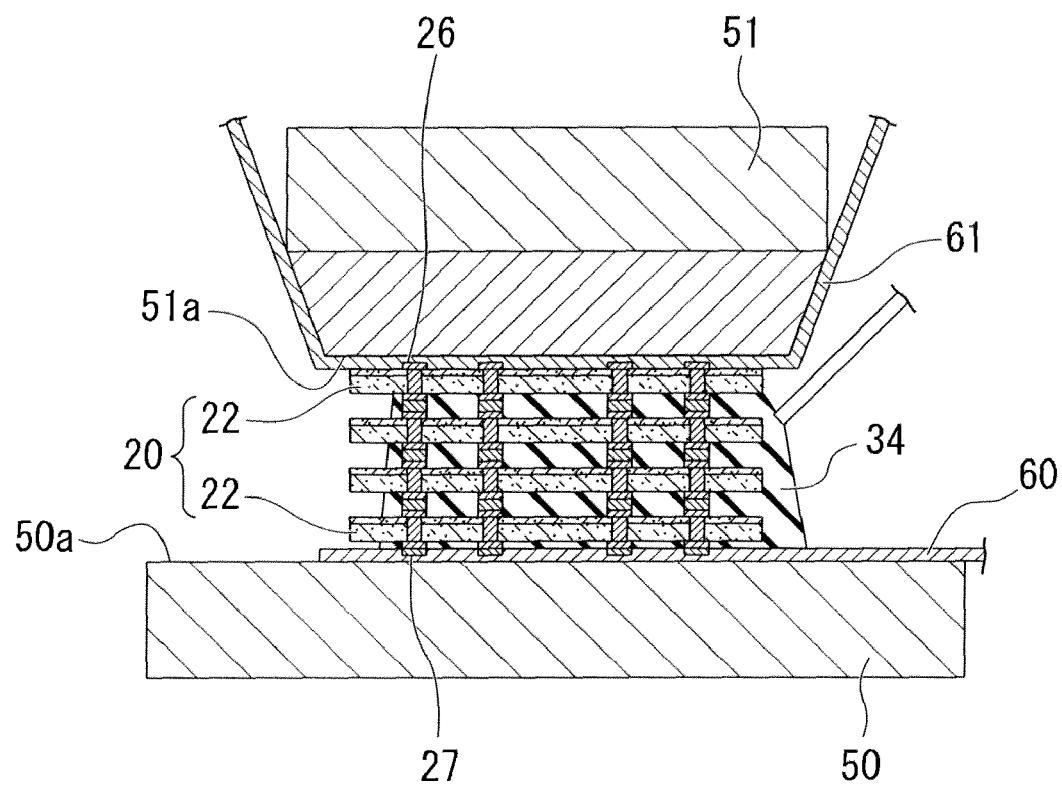
FIG. 3 is a fragmentary cross sectional elevation view illustrating the CoC semiconductor device in a step involved in a method of forming a CoC semiconductor device in accordance with another embodiment of the present invention.

The first sealing resin 34 fills between the semiconductor chips 22 as shown in FIG. 3.

The heater 51 is downed to contact a surface of an upper portion of the chip stack 20 (an uppermost semiconductor chip 22 of the chip stack 20). Pressing and pre-heating processes are started on the chip stack 20. While a lowermost semiconductor chip 22 is heated to a predetermined temperature by a heater of the heat stage 50, the chip stack 20 is heated from the uppermost semiconductor chip 22 to a predetermined temperature by the heater 51. Thereby, the chip stack 20 is heated from both sides of the uppermost semiconductor chip 22 and the lowermost semiconductor chip 22 to a predetermined temperature by the heater 51 and the heat stage 50, respectively.

The mounting surface 50a is covered by the first sheet 60. The contact surface 51a is covered by the second sheet 61. Even small gaps are not formed between the mounting surface 50a and the uneven lower surface of the chip stack 20 as long as the first sheet 60 is interposed between the mounting surface 50a and the uneven lower surface of the chip stack 20. Even small gaps are not formed between the contact surface 51a and the uneven upper surface of the chip stack 20 as long as the second sheet 61 is interposed between the contact surface 51a and the uneven upper surface of the chip stack 20. The whole surface of the uppermost semiconductor chip 22 of the chip stack 20 is in tightly contact with the first sheet 60. The whole surface of the lowermost semiconductor chip 22 of the chip stack 20 is in tightly contact with the second sheet 61. Thereby, the first sealing resin 34 does not enter into the small gaps between the mounting surface 50a and the uneven lower surface of the chip stack 20 and into the small gaps between the contact surface 51a and the uneven upper surface of the chip stack 20. The uppermost semiconductor chip 22 and the lowermost semiconductor chip 22 are not covered by the first sealing resin 34.

While the mounting surface 50a and the contact surface 51a are in tightly contact with the chip stack 20 via the first sheet 60 and the second sheet 61, respectively, the pre-heating process is performed by the heat stage 50 and the heater 51. The chip stack 20 is heated from the uppermost semiconductor chip 22 while the chip stack 20 is heated from the lowermost semiconductor chip 22. In some cases, the chip stack 20 is concurrently heated from the uppermost semiconductor chip 22 and the lowermost semiconductor chip 22.

In order that the mounting surface 50a and the contact surface 51a tightly contact the first sheet 60 and the second sheet 61, respectively, the heater 51 may apply weight to the chip stack 20 while heating the chip stack 20.

While the uppermost semiconductor chip 22 and the lowermost semiconductor chip 22 of the chip stack 20 are heated, the liquefied first sealing resin 34 is supplied to the chip stack 20 from a position near the side of the chip stack 20 by the applicator such as a nozzle 52. Thereby, the first sealing resin 34 fills in gaps between the semiconductor chips 22. The filling of the first sealing resin 34 is the same as that in the first embodiment and its description will be omitted.

The first sealing resin 34 is supplied while the first sheet 60 and the second sheet 61 tightly contact the uppermost semiconductor chip 22 and the lowermost semiconductor chip 22 of the chip stack 20, respectively. The first sealing resin 34 can be prevented from reaching a top surface or a bottom surface of the chip stack 20. Thereby, the first sealing resin 34 fills only the gaps between the semiconductor chips 22. The chip stack 20 whose top surface is not covered by the first sealing resin 34 can be formed.

Since the heater 51 tightly contacts to the uppermost semiconductor chip 22 indirectly through the second sheet 61 to heat the chip stack 20, the first sealing resin 34 can be prevented from reaching the top surface of the uppermost semiconductor chip 22 and filling the gaps between the semiconductor chips 22 can be well performed. When the first sealing resin 34 fills the gap between the semiconductor chips 22, the heater 51 tightly contacts to the uppermost semiconductor chip 22 through the second sheet 61 to heat the chip stack 20, thereby preventing that the first sealing resin 34 flows up to an upper portion of the chip stack 20 and that the first sealing resin 34 contacts the heater 51. Since the contact of the first sealing resin 34 with the heater 51 can be prevented, there can be prevented applying a mechanical stress to the semiconductor chip 22 when the heater 51 is detached from the chip stack 20. This will avoid applying any mechanical damage to the chip stack 20. The mechanical damage would be applied to the chip stack 20 if the second sheet 61 were not provided between the heater 51 and the chip stack 20 and the first sealing resin 34 were to contact directly with the heater 51 and then hardened.

The first sealing resin 34 is hardened by curing at a predetermined temperature so that the first sealing resin 34 becomes a first sealant 35.

Figure 4A:
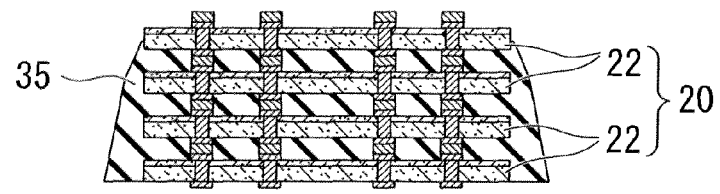
FIG. 4A is a fragmentary cross sectional elevation view illustrating the CoC semiconductor device in a step, subsequent to the step of FIG. 3, involved in the method of forming the CoC semiconductor device in accordance with another embodiment of the present invention.
Figure 4B:
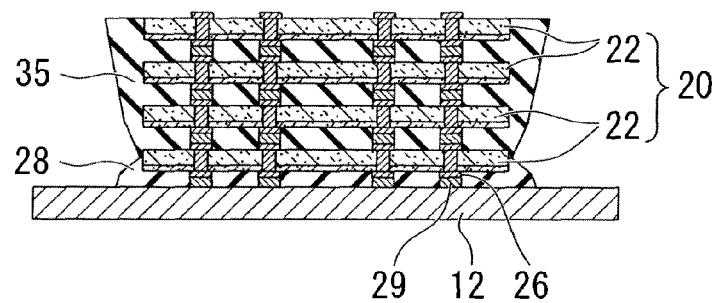
FIG. 4B is a fragmentary cross sectional elevation view illustrating the CoC semiconductor device in a step, subsequent to the step of FIG. 1B, involved in the method of forming the CoC semiconductor device in accordance with another embodiment of the present invention.

The chip stack 20 in which the first sealant 35 is formed to show the uppermost surface of the uppermost semiconductor chip 22 is mounted on the wiring board 12 so that the shown surface of the uppermost semiconductor chip 22 faces the wiring board 12 as shown in FIGS. 4A and 4B. The uppermost surface is shown without being covered by the first sealant 35 so that the chip stack 20 can be preferably mounted on the wiring board 12.

The mounting of the chip stack 20 on the wiring board 12 may include the following processes. An insulating adhesive 28, for example, a non conductive paste (NCP) is applied on a predetermined position of the wiring board 12. The flip-chip binding process is performed using a flip chip bonder (not shown), thereby electrically connecting first bump electrodes 26 of the shown surface of the chip stack 20 and connection pads 29 of the wiring board 12. Since the insulating adhesive 28 is disposed between the chip stack 20 and the wiring board 12, there can be prevented occurrence of voids in the process of forming the second sealant, which will be described later.

Figure 4C:
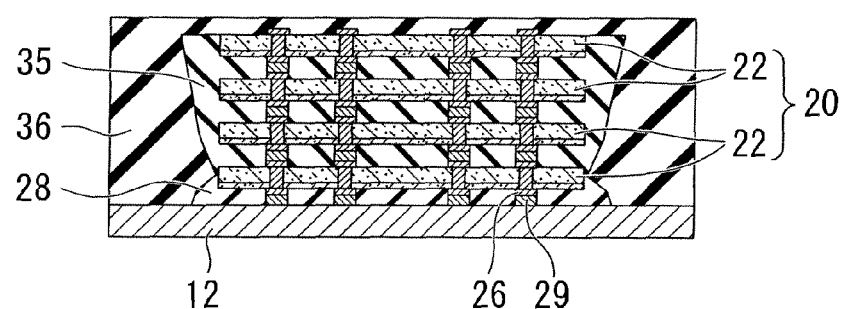
FIG. 4C is a fragmentary cross sectional elevation view illustrating the CoC semiconductor device in a step, subsequent to the step of FIG. 4B, involved in the method of forming the CoC semiconductor device in accordance with another embodiment of the present invention.

As shown in FIG. 4C, the chip stack 20 with the first sealant 35 is sealed using the second sealing resin 36. Sequentially, known processes are performed of forming BGA semiconductor devices such as a process of mounting solder balls on the other surface of the wiring board 12 and a subsequent process of dicing the wiring board 12 for each product formation region.

According to the method of forming the semiconductor device of this embodiment, as in the first embodiment, there can be reduced the difference in temperature between the uppermost semiconductor chip 22 and the lowermost semiconductor chip 22 of the chip stack 20. The first sealing resin 34 can flow uniformly through any different gaps between the semiconductor chips 22. The first sealing resin 34 can be prevented from contacting the surface of the chip stack 20. Thus, the first sealant 35 can be prevented from contacting the first bump electrode 26 protruding from the one surface of the chip stack 20 and the second bump electrode 27 protruding from the other surface. The uppermost surface of the chip stack 20 can be preferably shown. In the following process, when the wiring board 12 or other chips are bonded to the chip stack 20, it is possible to easily perform the bonding process between bump electrodes.

Even if the first sealing resin 34 is adhered to the first sheet 60 or the second sheet 61, the first sheet 60 or the second sheet 61 stained may be disposed and new product ones of the first sheet 60 or the second sheet 61 can be used. It is unnecessary to frequently clean the heat stage 50 or the heater 51. Thus, the regular maintenance work can be reduced and the workability can be improved.

Since the contact of the first sealing resin 34 with the heater 51 can be prevented, there can be prevented applying a mechanical stress to the semiconductor chip 22 when the heater 51 is detached from the chip stack 20. This will avoid applying any mechanical damage to the chip stack 20. The mechanical damage would be applied to the chip stack 20 if the second sheet 61 were not provided between the heater 51 and the chip stack 20 and the first sealing resin 34 were to contact directly with the heater 51 and then hardened.

As described above, according to the present embodiment, it is possible to improve workability and reliability in addition to the advantages of the first embodiment.

As used herein, the following directional terms "forward, rearward, above, downward, vertical, horizontal, below, transverse, upper, and lower" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, the method comprising:
    filling a gap of a semiconductor chip stack with a sealing agent while carrying out a first heating process which heats the semiconductor chip stack from upper and lower portions of the semiconductor chip stack.

2. The method according to claim 1, wherein the first heating process is started before filling the gap of a semiconductor chip stack.

3. The method according to claim 2, further comprising:
    hardening the sealing agent by carrying out a second heating process which heats the semiconductor chip stack after the first heating process the semiconductor chip stack.

4. The method according to claim 1, wherein the first heating process comprises:
    concurrently heating the upper and lower portions of the semiconductor chip stack.

5. The method according to claim 4, wherein concurrently heating the upper portion and the lower portion of the semiconductor chip stack comprises:
    concurrently heating the upper portion of the semiconductor chip stack by a heater and the lower portion of the semiconductor chip stack by a heat stage.

6. The method according to claim 5, further comprising:
    disposing a first sheet on a surface of the heater before the first heating process; and
    disposing a second sheet on a surface of the heat stage before the first heating process.

7. The method according to claim 5, wherein concurrently heating the upper portion of the semiconductor chip stack by the heater and the lower portion of the semiconductor chip stack by the heat stage comprises:
    concurrently heating the upper portion of the semiconductor chip stack by the heater and the lower portion of the semiconductor chip stack by the heat stage, the heater being substantially the same in temperature as the heat stage.

8. The method according to claim 4, wherein the heater has a contact portion which is greater in area than the upper portion of the semiconductor chip stack,
    wherein the heat stage is greater in area than the lower portion of the semiconductor chip stack.

9. The method according to claim 1, wherein the first heating process comprises:
    heating the semiconductor chip stack at a temperature which causes the sealing agent to flow.

10. A method of forming a semiconductor device, the method comprising:
    filling between first and second semiconductor chips of a semiconductor chip stack with a sealing agent while heating the first and second semiconductor chips of the semiconductor chip stack using a heater and a heat stage, the first semiconductor chip being heated by at least the heat stage, the second semiconductor chip being heated by at least the heater, heating the first and second semiconductor chips being started before filling between the first and second semiconductor chips of a semiconductor chip stack.

11. The method according to claim 10, wherein heating the first and second semiconductor chips of the semiconductor chip stack comprises:
    concurrently heating the first and second semiconductor chips of the semiconductor chip stack.

12. The method according to claim 10, further comprising:
    pressing the semiconductor chip stack by the heater.

13. The method according to claim 10, further comprising:
    curing the sealing agent by increasing a temperature of the heater and the heat stage.

14. The method according to claim 10, wherein the heater has a contact portion which is greater in area than the second semiconductor chip,
    wherein the heat stage is greater in area than the first semiconductor chip.

15. A method of forming a semiconductor device, the method comprising:
    stacking a plurality of semiconductor chips to form a chip stack structure;
    heating the chip stack structure to apply thermal energy to the chip stack structure from both of lowermost and uppermost ones of the semiconductor chips of the chip stack structure; and
    supplying a sealing resin to fill gaps between the semiconductor chips while heating the chip stack structure.

16. The method according to claim 15, wherein heating the chip stack structure comprises:
    sandwiching the chip stack structure between first and second heaters.

17. The method according to claim 16, further comprising:
    disposing a first sheet between the lowermost one of the plurality of semiconductor chips of the chip stack structure and the first heater before heating the chip stack structure, and
    disposing a second sheet between the uppermost one of the plurality of semiconductor chips of the chip stack structure and the second heater before heating the chip stack structure.

18. The method according to claim 15, further comprising:
    heating up the chip stack structure after applying the sealing resin to harden the sealing resin.

19. The method according to claim 15, further comprising:
    mounting the chip stack structure on a wiring board after applying the sealing resin.

20. The method according to claim 15, wherein stacking the plurality of semiconductor chips comprises:
    stacking the plurality of the semiconductor chips on a wiring board to form the chip structure on the wiring board.

* * * * *